(12) United States Patent
Pape et al.

(10) Patent No.: US 9,357,301 B2
(45) Date of Patent: May 31, 2016

(54) METHOD AND DEVICE FOR REDUCING ACOUSTIC FEEDBACK

(71) Applicant: SIVANTOS PTE. LTD., Singapore (SG)

(72) Inventors: Sebastian Pape, Erangen (DE); Tobias Wurzbacher, Fuerth (DE)

(73) Assignee: Sivantos Pte. Ltd., Singapore (SG)

(*) Notice: Subject to any disclaimer, the term of this patent is extended or adjusted under 35 U.S.C. 154(b) by 82 days.

(21) Appl. No.: 14/358,283

(22) PCT Filed: Oct. 17, 2012

(86) PCT No.: PCT/IB2012/055660
§ 371 (c)(1),
(2) Date: May 15, 2014

(87) PCT Pub. No.: WO2013/072792
PCT Pub. Date: May 23, 2013

(65) Prior Publication Data
US 2014/0314252 A1    Oct. 23, 2014

Related U.S. Application Data

(60) Provisional application No. 61/559,787, filed on Nov. 15, 2011.

(51) Int. Cl.
| | |
|---|---|
| *H04B 15/00* | (2006.01) |
| *H04R 3/02* | (2006.01) |
| *G10K 11/178* | (2006.01) |
| *H03G 3/00* | (2006.01) |
| *H03F 1/36* | (2006.01) |
| *H04R 25/00* | (2006.01) |

(52) U.S. Cl.
CPC .............. *H04R 3/02* (2013.01); *G10K 11/1784* (2013.01); *H03F 1/36* (2013.01); *H03G 3/001* (2013.01); *H04R 25/453* (2013.01)

(58) Field of Classification Search
None
See application file for complete search history.

(56) References Cited

U.S. PATENT DOCUMENTS

| | | | |
|---|---|---|---|
| 8,917,891 B2 * | 12/2014 | Natarajan | H04R 25/453 381/318 |
| 2007/0297627 A1 | 12/2007 | Puder | |
| 2009/0028367 A1 | 1/2009 | Klinkby | |
| 2011/0103613 A1 * | 5/2011 | Van Der Werf | H04R 25/453 381/93 |

OTHER PUBLICATIONS

Simon Haykin, Adaptive Filter Theory, Oct. 12, 2001, Prentice Hall, Upper Saddle River, NJ.
Toon Van Waterschoot, Marc Moonen, Fifty Years of Acoustic Feedback Control: State of the Art and Future Challenges, Proceedings of the IEEE, Feb. 2011, 288-327, vol. 99, No. 2.

* cited by examiner

*Primary Examiner* — Muhammad N Edun
(74) *Attorney, Agent, or Firm* — Laurence A. Greenberg; Werner H. Stemer; Ralph E. Locher

(57) ABSTRACT

Acoustic feedback in an audio device is reduced or eliminated via a feedback compensator. The feedback compensator disposes of at least one adaptive filter whose adaptation is governed by a step-size parameter μ. A step-size parameter μ of the adaptive filter is set at a high level to eliminate acoustic feedback and the parameter μ is decreased when a critical excitation signal is detected. This way to proceed allows for efficient elimination of feedback whistling while required environment signals are retained.

11 Claims, 2 Drawing Sheets

METHOD AND DEVICE FOR REDUCING ACOUSTIC FEEDBACK

FIELD OF THE INVENTION

The present invention relates to a method for reducing acoustic feedback. In addition, the invention relates to a corresponding device for reducing acoustic feedback. In particular, the reduction of acoustic feedback refers to reducing acoustic feedback in audio systems, such as hearing instruments.

BACKGROUND OF THE INVENTION

Audio systems often comprise at least one receiver, such as a microphone, for receiving environmental sound, a downstream signal processing unit, such as an amplifier, and at least one audio output device, such as a loudspeaker. A hearing instrument belongs to such an audio system.

A typical hearing instrument and audio system is illustrated in the following figures, in which:

FIG. 1 shows the basic structure of a typical hearing instrument,

FIG. 2 shows a block circuit diagram of an audio system with an adaptive feedback compensator.

FIG. 1 illustrates the basic structure of a typical hearing instrument. The hearing instrument comprises a housing 1. Inside the housing 1, there are microphones 2, a signal processing unit 3, a loudspeaker 4, and a battery 5. The signal processing unit 3 includes signal input ports 6 and a signal output port 7. The signal input ports 6 are connected with microphones 2; and the signal output port 7 is connected with the loudspeaker 4. The battery 5 is connected to the signal processing unit 3 to supply power. The microphones 2 receive environmental sound and output a microphone signal. Subsequently, the microphone signal gets processed by the signal processing unit 3. The loudspeaker 4 converts the processed signal output from the signal processing unit 3 into sound.

A major problem of such audio systems is feedback whistling. The sound from the loudspeaker can reenter the audio system through the microphone, get further amplified, and then be emitted through the loudspeaker. In this situation, a closed loop (microphone->amplifier->loudspeaker->microphone, and so on) is built up, and feedback whistling occurs when the total system gain exceeds a certain threshold.

Feedback whistling can be reduced or even eliminated by feed-back cancellers. A known feedback canceller is an adaptive feedback compensator, which relies on an adaptive filter that models the time-variant acoustic feedback path transfer function g.

A common example of an adaptation rule for the update of the adaptive filter coefficients h is the normalized least mean square (NLMS) algorithm:

$$h(k+1)=h(k)+p[(e*(k)x(k))/(x*(k)x(k))].$$

In this formula, k represents the discrete time index, x is the input to the adaptive feedback compensator, e=m−c is the error signal defined as the difference of the microphone signal m and the feedback compensation signal c, p represents the step-size parameter that controls the adaptation speed of the adaptive filter, and * denotes the conjugate complex operation.

A block circuit diagram of an audio system with an adaptive feedback compensator is shown in FIG. 2. Here, the time de-pendency (discrete time index k) is omitted for simplification. The feedback sound f from an audio output (e.g. loud-speaker 13) is fed back via the acoustic feedback path 15 to the receiver (e.g. microphone 10). This acoustic feedback path 15 is equipped with a transfer function g. In addition to the feedback sound f, the microphone 10 also picks up a required sound s which is a useful environmental sound required to be amplified, and outputs a microphone signal m.

The microphone signal m is subsequently processed by a signal processing device 11, which is located between the microphone and the loudspeaker 13. The signal processing device 11 comprises a core signal processing unit 12 (SP), a feedback compensator 14 (FBC), and a subtractor. The feedback compensator 14 outputs a feedback compensation signal c, which is subtracted from the microphone signal m in the subtractor, so an error signal e=m−c is obtained. The error signal e further enters the core signal processing unit 12 and outputs a signal x. The output signal x is fed to the loudspeaker 13 and to the feedback compensator 14. The feedback compensator 14 employs a transfer function h, which estimates the acoustic feedback path transfer function g. Therefore, the feedback compensation signal c, which is generated from the feedback compensator 14, reads c=h*x. In addition, the feedback compensator 14 is also controlled by the error signal e.

More details are given in recent literature, such as: S. Hay-kin, Adaptive Filter Theory. Englewood Cliffs, N.J.: Prentice-Hall, 1996; and Toon van Waterschoot and Marc Moonen, "Fifty years of acoustic feedback control: state of the art and future challenges", Proc. IEEE, vol. 99, no. 2, February 2011, pp 288-327.

As mentioned before, the parameter p, also called the step-size parameter, controls the adaptation speed of an adaptive filter. A proper, time-dependent controlling of p is demanded for an effective and stable feedback canceller behavior: If p is large, the adaptive filter quickly adapts to situation changes of the acoustic feedback path 15 and thus prevents whistling. On the other side, if p is permanently too high, erroneous adaptations for strongly correlated excitation signals (e.g. music, the clinking of glass or cutlery) may arise.

Previously, feedback detectors were used to control the step-size p in a way that the step-size p will be increased if feedback is detected and reduced if no feedback is detected. With this method, it is possible to eliminate feedback very efficiently and to avoid artifacts.

The conventional method above has the following two problems to be dealt with:

1) An initiation by whistling is always needed. In other words, it is not possible to detect feedback before whistling starts. The reason is that if the feedback path changes fast, whistling will start after a short time.

2) The amount of artifacts is dependent on the quality of feedback detections. Misdetections can cause a large amount of artifacts. The main challenge here is to distinguish between feedback whistling and required signals from the environment like flutes, bells and all other sounds, which are strongly correlated excitation signals and, in the worst ca-se, sinusoidal. Here, a required signal is a signal that is needed or at least desirable to be provided for authentic representation of the respective sound environment.

Therefore, properly controlling step-size parameter p is crucial to aim feedback reduction systems. There exist several concepts for suitably controlling step-size parameter p in the prior art. However, all of them require making compromises. In the following, two prior art concepts are presented:

1. Optimal step-size estimate. Taking into account some simplifications and assumptions, a theoretical optimum step-size p can be derived as $$popt=E\{IcI\}/E\{IeI\}$$

where E{ } denotes the expectation operator.

The derived formula helps to stabilize the adaptation, but does not solve the problem. In practice, the assumptions made for the derivation (e.g. assuming uncorrelated receiver and microphone signals, assuming the unknown acoustic feedback path transfer function to be zero), are often not fulfilled, leading to a deterioration of the performance.

2. A triggered adaptation by feedback detectors. The scenario is following: In normal mode the adaptation is frozen via a small value of p. The adaptation is only allowed if a feed-back detector gets active, indicating a change in the acoustic feedback path. As a consequence, the need for a re-adaptation of the feedback compensator transfer function h is triggered by a temporal increase of the step-size parameter p.

On one hand, freezing the adaptation guarantees stability (i.e. no erroneous adaptation for strongly correlated excitation signals), as long as no feedback detector gets erroneously active. On the other hand, the feedback canceller adapts only if the feedback detector gets active. In everyday life, it may happen quite often that the acoustic feedback path changes only slightly (e.g. passing a door, sitting down on a couch), which provokes no feedback detection. As there is no adaptation, the state of the feedback compensator transfer function h does not represent the current acoustic feedback path, resulting in an audible rough sound quality. The reduced sound quality will last on until a feedback detector gets active, which is usually accompanied with a feedback whistling. As a countermeasure, the sensitivity of the feedback detector could be adjusted. Therefore, minimal changes of the acoustic feedback path are detected, but at the cost of increased erroneous feedback detections leading to increased artifacts.

Both of the above methods for controlling p can be used together. Nevertheless, the user has to live with a compromise: He either accepts a rough sound quality for non-detected path changes or puts up with false feedback detections incurring the risk of erroneous adaptations that leads to tonal disturbances or other processing artifacts.

SUMMARY OF THE INVENTION

The object of the present invention consists in combining the reduction or even elimination of acoustic feedback with an efficient avoidance of artifacts.

According to the invention, this object is achieved by a method for reducing acoustic feedback of an audio device by a feedback compensator, said feedback compensator having at least one adaptive filter, which comprises the steps of: setting step-size parameter p of said adaptive filter high enough to eliminate acoustic feedback and decreasing said parameter p when critical excitation signals are detected. Critical excitation signals are excitation signals that interfere with the adequate representation of the respective sound environment and may give rise to feedback whistling. Such signals may be (strongly) correlated, tonal and impulsive signals.

The step-size parameter p usually controls adaptation speed of said adaptive filter. A step-size controller may be used to control the step-size parameter p.

According to an embodiment of the present invention, a feedback detector or a detector for correlated signal is used to detect said strongly correlated excitation signals.

The present method also may comprise processing signals by a (core) signal processing unit before they are fed into an audio output.

According to the present invention, the audio device for reducing acoustic feedback comprises a feedback compensator. This feedback compensator is equipped with at least one adaptive filter. A step-size parameter p of said adaptive filter is set high enough to eliminate acoustic feedback and it is decreased when strongly correlated excitation signals are detected.

The audio device also may comprise a step-size controller for controlling the step-size parameter p, a feedback detector or a detector for correlated signal to detect said strongly correlated excitation signals, and a (core) signal processing unit for processing signals before they are fed into an audio output.

According to an embodiment of the invention, excitation signals are subjected to frequency decomposition into frequency subbands. This decomposition allows for selectively applying the present method to one, two or more subbands.

This new approach to control the step-size parameter p reverses the conventional method: In normal mode the adaptation runs very fast with a very high value of p. If p is high enough, feedback whistling can be eliminated completely. In that case, if feedback is detected, it is a misdetection. That means that the detected feedback is not real feedback whistling, but a strongly correlated excitation signal from the environment. Consequently, p is decreased, which allows for avoiding artifacts very efficiently.

With this new approach, the challenge to distinguish between feedback whistling and needed strongly correlated excitation signals from the environment is not necessary anymore. Feed-back whistling cannot occur within a certain range above the critical gain, and artifacts are avoided efficiently. The approach can be combined with measures to stabilize the adaption, e.g.—but not limited to—such as frequency shift, frequency transposition and optimal step-size estimation technologies.

The present method can be used for reducing acoustic feedback in a hearing device, such as a hearing instrument, a headset, a headphone and the like.

Correspondingly, the present acoustic device can be a hearing device, such as a hearing instrument or a headset or a headphone and the like.

DETAILED DESCRIPTION OF THE INVENTION

Figure 1:
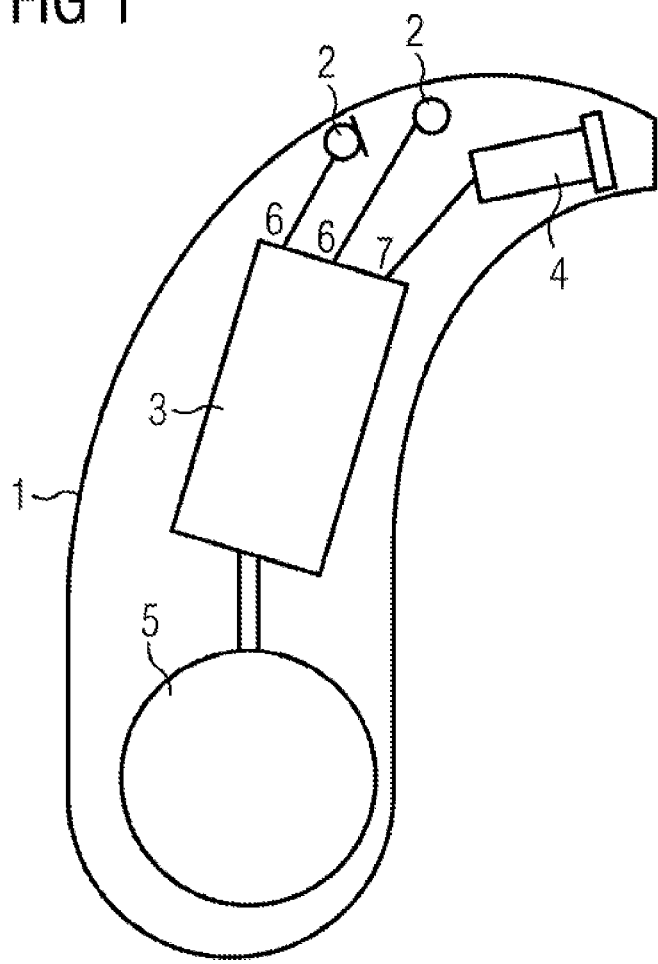
FIG. 1 shows the basic structure of a typical hearing instrument.
Figure 2:
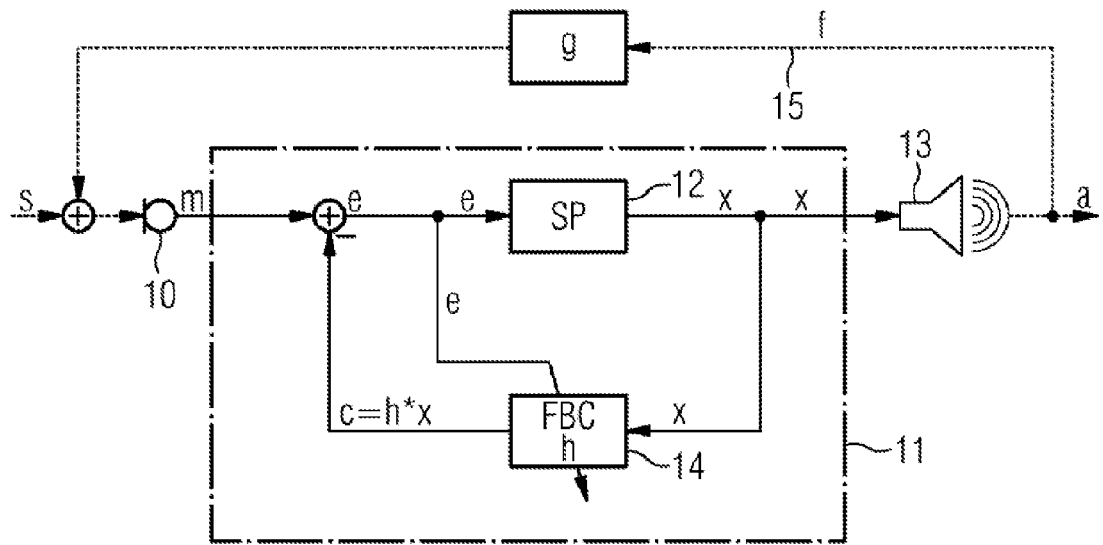
FIG. 2 shows a block circuit diagram of an audio system with an adaptive feedback compensator.
Figure 3:
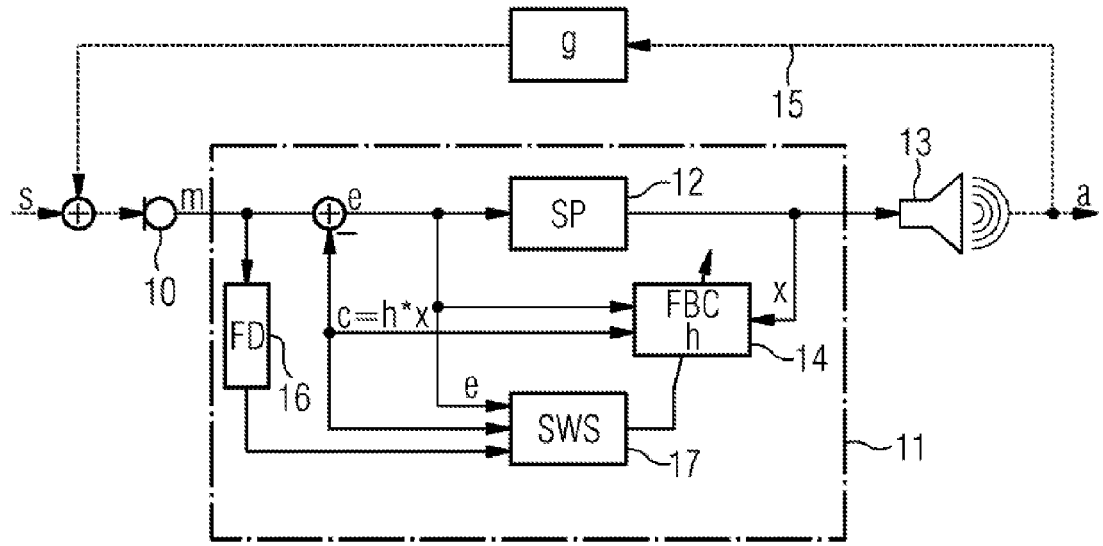
FIG. 3 shows a block circuit diagram of a feedback reduction system with a step-size controller.

FIG. 3 illustrates a block circuit diagram of a feedback reduction system with a step-size controller. In comparison with the feedback reduction system shown in FIG. 2, a feedback detector 16 (FD) and a step-size controller 17 (SSC) are added. The feedback detector 16 is placed to receive the microphone signal m as an input signal. Its output signal is fed to the step-size controller 17, which is further connected to a feedback compensator 14. An output signal from the step-size controller 17 is emitted to the feedback compensator 14 to control the step-size parameter p of an adaptive filter within the feedback compensator 14.

The block circuit diagram of a feedback reduction system according to the present embodiment is shown in FIG. 3. Here, the time dependency (discrete time index k) is omitted for simplification. A receiver (e.g. microphone 10) receives a feedback sound f which is fed back via the acoustic feedback path 15 from an audio output (e.g. loudspeaker 13) to the microphone 10, as well as a required sound s, and outputs a microphone signal m. The microphone signal m is then processed by a signal processing device 11, which is located between the microphone 10 and the loudspeaker 13. The signal processing device 11 comprises a core signal processing unit 12 (SP), a feedback compensator 14 (FBC), a subtractor, a feed-back detector 16 (FD) and a step-size controller 17 (SWS). The feedback compensator 14 outputs feedback compensation signal c, which is subtracted from the microphone signal m in the subtractor, so an error signal e=m−c is obtained. The error signal e further enters the core signal processing unit 12, which outputs a signal x. The output signal x is fed to the loudspeaker 13 and to the feedback compensator 14. The feedback detector 16 is placed to detect the microphone signal m. The signal output from the feedback detector 16 is emitted to the step-size controller 17, which is connected with the feedback compensator 14 and controls the step-size parameter p of an adaptive filter within the feedback compensator 14. In addition, the feedback compensator 14 is also controlled by the error signal e.

In contrast to previous approaches, in which p will be increased if feedback is detected and reduced if no feedback is detected, p is set at a high value in normal mode according to the present approach. The adaptation speed of the adaptive filter, which is controlled by the parameter p, will be very fast in normal mode. Therefore, the adaptive filter quickly adapts to situation changes of the acoustic feedback path 15 and thus prevents whistling. As an embodiment for the present invention, a high value in our terms is p=0.06. In contrast, a previous fast adaptation could exemplarily have a value of p=0.004, which is 15 times less than our high value of p. With the high value of p, feedback whistling can be eliminated completely in the present approach.

However, in the present approach, the parameter p is not permanently at a high level. When strongly correlated excitation signals are detected by the feedback detector 16, the step size controller 17 reduces parameter p immediately. In other times, parameter p is kept at said high level.

According to the present invention, acoustic feedback can be eliminated completely. Therefore, the strongly correlated ex-citation signal detected by the feedback detector 16 is not feedback whistling, but a required signal which is similar to feedback whistling, such as tonal music. Thus, this required signal will not be suppressed, because the step-size controller 17 decreases the parameter p to a low value as soon as said required signal is detected. Compared with previous approaches, artifacts can be avoided very efficiently in the present invention.

In addition, in the present invention, as the strongly correlated excitation signal detected by the feedback detector 16 can only be a required signal, there is no need to distinguish between feedback whistling and a required strongly correlated excitation signal from environment. Hence, there is no restriction of the feedback detector 16. It can be any kind of existing feedback detector, or a special detector for correlated signals, and the faster the better.

The feedback reduction system according to the present invention can be a hearing device, such as a hearing instrument, a headset or a headphone.

The invention claimed is:

1. A method of reducing acoustic feedback of an audio device by a feedback compensator, the feedback compensator having at least one adaptive filter, the method comprising the steps of:

setting a step-size parameter p of the adaptive filter at a high level to eliminate acoustic feedback;

using a feedback detector to detect a critical excitation signal being a tonal signal, wherein the tonal signal is a microphone signal which is received by the feedback detector; and when the critical excitation signal is detected, decreasing the step-size parameter p;

wherein the step-size parameter p controls an adaptation speed of the adaptive filter and wherein the step-size parameter p is set at 0.06 or more to eliminate acoustic feedback.

2. The method according to claim 1, which comprises controlling the step-size parameter p with a step-size controller.

3. The method according to claim 1, which comprises processing signals with a signal processing unit prior to the signals being fed to an audio output.

4. The method according to claim 1, which comprises using a detector for correlated signals to detect the critical excitation signal.

5. The method according to claim 1, which comprises carrying out a frequency decomposition of excitation signals into frequency subbands, and selectively applying the method to at least one subband.

6. The method according to claim 1, which comprises employing the method for stabilizing adaption of an adaptive filter.

7. An audio device, comprising:

a feedback compensator for reducing acoustic feedback, said feedback compensator containing at least one adaptive filter controlled with a step-size parameter p;

a feedback detector configured to detect a critical excitation signal being a tonal signal, wherein the tonal signal is a microphone signal which is received by said feedback detector; and a step-size controller configured for setting the step-size parameter p of said adaptive filter at a relatively high level to eliminate acoustic feedback;

said step-size controller configured for decreasing the step-size parameter p when said feedback detector detects the critical excitation signal;

wherein the critical signal is a tonal signal; and wherein the step-size parameter p controls an adaptation speed of said adaptive filter and wherein the step-size parameter p is set at 0.06 or more to eliminate acoustic feedback.

8. The audio device according to claim 7, further comprising a step-size controller configured for controlling the step-size parameter p.

9. The audio device according to claim 7, further comprising a signal processing unit for processing signals before the signals are fed to an audio output.

10. The audio device according to claim 7, further comprising a detector for correlated signals to detect the critical excitation signal.

11. The audio device according to claim 7, configured for operation to perform a frequency decomposition of excitation signals into subbands.

* * * * *